United States Patent
Dijon et al.

(10) Patent No.: US 8,034,218 B2
(45) Date of Patent: Oct. 11, 2011

(54) LOW TEMPERATURE GROWTH OF ORIENTED CARBON NANOTUBES

(75) Inventors: Jean Dijon, Champagnier (FR); Hélène Le Poche, Grenoble (FR); Thomas Goislard de Monsabert, Saint Ismier (FR)

(73) Assignee: Commissariat a l'Energie Atomique, Paris (FR)

( * ) Notice: Subject to any disclaimer, the term of this patent is extended or adjusted under 35 U.S.C. 154(b) by 704 days.

(21) Appl. No.: 11/174,537

(22) Filed: Jul. 6, 2005

(65) Prior Publication Data

US 2006/0177602 A1   Aug. 10, 2006

(30) Foreign Application Priority Data

Jul. 7, 2004 (FR) .................. 04 07529

(51) Int. Cl.
*C23C 14/34* (2006.01)
(52) U.S. Cl. .......... 204/192.12; 204/298.11; 204/192.15
(58) Field of Classification Search ............ 204/192.12, 204/298.11, 192.15
See application file for complete search history.

(56) References Cited

U.S. PATENT DOCUMENTS

| | | | | |
|---|---|---|---|---|
| 3,708,418 A | * | 1/1973 | Quinn | 204/298.37 |
| 5,298,137 A | * | 3/1994 | Marshall, III | 204/192.12 |
| 5,482,601 A | * | 1/1996 | Ohshima et al. | 204/173 |
| 5,773,921 A | * | 6/1998 | Keesmann et al. | 313/309 |
| 2002/0160111 A1 | | 10/2002 | Sun et al. | |
| 2002/0179564 A1 | * | 12/2002 | Geobegan et al. | 216/7 |
| 2003/0188963 A1 | * | 10/2003 | Takikawa et al. | 204/164 |

FOREIGN PATENT DOCUMENTS

| | | |
|---|---|---|
| DE | 199 46 182 A1 | 3/2001 |
| JP | 07321446 A * | 12/1995 |
| WO | WO 02/059392 A1 | 8/2002 |
| WO | WO 03/046255 A1 | 6/2003 |
| WO | WO 2004/027108 A2 | 4/2004 |

OTHER PUBLICATIONS

U.S. Appl. No. 11/632,944, filed Jan. 19, 2007, Dijon, et al.
U.S. Appl. No. 11/671,825, filed Feb. 6, 2007, Dijon, et al.
Kuei-Yi Lee, et al., "Method for Aligned Bamboolike Carbon Nanotube Growth Using RF Magnetron Sputtering", Japanese Journal of Applied Physics, vol. 42, No. 2A, XP-001164841, Feb. 2003, pp. 713-715.

* cited by examiner

*Primary Examiner* — Keith Hendricks
*Assistant Examiner* — Jason M Berman
(74) *Attorney, Agent, or Firm* — Oblon, Spivak, McClelland, Maier & Neustadt, L.L.P.

(57) ABSTRACT

The invention concerns a method for growing oriented carbon nanotubes on a sample using a target of carbon or a variety of carbon in a deposition chamber where a plasma predominates. The sample (16) is arranged in contact with the target (15), in such a way that the target has a free surface and that the sample offers a free surface, the plasma causing the growth of carbon nanotubes on the free surface of the sample.

14 Claims, 3 Drawing Sheets

LOW TEMPERATURE GROWTH OF ORIENTED CARBON NANOTUBES

TECHNICAL FIELD

The invention concerns the low temperature growth of oriented carbon nanotubes.

State of the Prior Art

Numerous methods for manufacturing carbon nanotubes (CNT) have been proposed. They may be classified into two categories: methods that produce bulk materials and methods that produce nanotubes on surfaces or on components.

In the first category, one finds:
- the first syntheses carried out at high temperature by arc (S. IIJIMA, "Helical Microtubules of Graphitic Carbon", Nature 354, 56, 1991);
- laser syntheses (T. GUO et al., "Self-Assembly of Tubular Fullerenes", J. Phys. Chem 99, 10 694, 1995);
- electrochemical syntheses (W. K. HSU et al., Nature 377, 687, 1995);
- pyrolytic syntheses (M. ENDO et al. "Pyrolytic Carbon Nanotubes from Vapor Grown Carbon fiber", Carbon 33, p. 873, 1995).

In the second category are found catalytic synthesis methods using a thermal CVD deposit, a thermal CVD deposit assisted by hot filament or a thermal CVD deposit assisted by plasma (M. MEYYAPPAN et al., "Carbon Nanotube Growth by PECVD: A Review" Plasma Sources Sci. Technol. 12 (May 2003) 205-216). In all cases, the intake of carbon is achieved by means of a reactive hydrocarbon gas ($C_2H_2$, $CH_4$, etc.) or carbon monoxide.

Methods using the radiofrequency cathodic sputtering of a graphite target do not work without the addition of a filament heated to 2000° C. The species coming from the target do not allow the growth of nanotubes to be obtained. The addition of a hot filament causes the cracking of the species and makes them efficient to react on a catalyst (K. LEE et al., "Method for aligned bamboolike carbon nanotubes growth using RF magnetron sputtering", Jpn J. Appl. Phys., Vol. 42 (2003), p. 713-715).

FIG. 1 is a schematic view of an RF sputtering device according to the prior art, enabling the growth of carbon nanotubes. The device comprises, in a deposition chamber, a first electrode 1 (cathode) serving as a sample-holder and a second electrode 2 (anode) placed opposite. An RF generator 3, connected in series with a capacitor 4, makes it possible to provide an RF voltage between the electrodes 1 and 2. The electrode 2 bears, on its face located opposite the electrode 1, a graphite target 5. The electrode 1 bears, on its face located opposite the electrode 2, a sample 6 intended to receive a deposit of nanotubes. Between the target 5 and the sample 6 is arranged, near to the sample, a filament 7 heated to the temperature required to obtain the cracking of the graphite coming from the target.

DESCRIPTION OF THE INVENTION

The present invention enables the growth of vertical carbon nanotubes on surfaces or devices using a solid carbon target, without the addition of a hot filament.

The subject of the invention is therefore a method for growing oriented carbon nanotubes on a sample using a target of carbon or a variety of carbon in a deposition chamber where a plasma predominates, characterised in that the sample is arranged in contact with the target, in such a way that the target has a free surface and that the sample offers a free surface, the plasma causing the growth of carbon nanotubes on the free surface of the sample.

The plasma may be a hydrogen plasma. It may be a plasma of a gaseous mixture comprising hydrogen. The gaseous mixture may comprise at least one noble gas, chosen for example from among argon, krypton and xenon. It may comprise nitrogen or ammonia. It may comprise a carbonated gas such as CO or acetylene.

Advantageously, the free surface offered by the sample bears, at least partially, a catalytic layer.

The method may be carried out at a temperature above 300° C.

According to a specific embodiment, the free surface of the target has a grid shape.

The target may consist in a deposit carried out on the sample.

The method according to the invention may be applied to the growth of carbon nanotubes on a substrate in semiconductor material or in glass. It may also be used to obtain the growth of oriented carbon nanotubes at the base of triode cavities of a field emitting emission plate, said carbon nanotubes then constituting electron emission sources.

BRIEF DESCRIPTION OF DRAWINGS

The invention will be more fully understood and other advantages and particularities will become clearer on reading the following description, given by way of indication and in nowise limitative, as well as the appended drawings in which.

DETAILED DESCRIPTION OF SPECIFIC EMBODIMENTS

Figure 1:
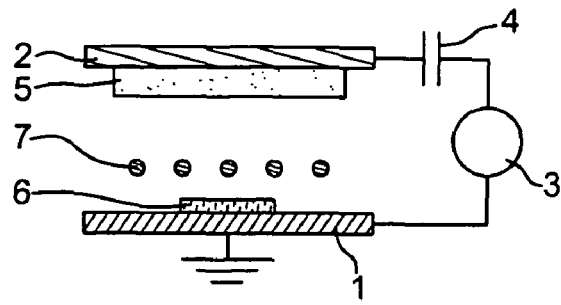
FIG. 1, already described, is a schematic view of an RF sputtering device enabling the growth of carbon nanotubes according to the prior art.
Figure 2:
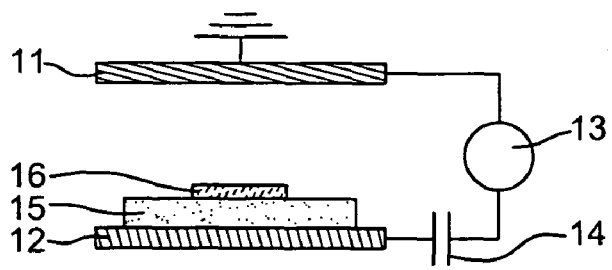
FIG. 2 is a schematic view of a device enabling the growth of carbon nanotubes according to the invention.

FIG. 2 is a schematic view of a device enabling the growth of carbon nanotubes according to the invention. The device comprises, in a deposition chamber, a first electrode 11 (cathode) and a second electrode 12 (anode) placed opposite. An RF generator 13, connected in series with a capacitor 14, makes it possible to provide an RF voltage between the electrodes 11 and 12. The electrode 12 bears as a stacking, on its face located opposite the electrode 11, a graphite target 15 and a sample 16 intended to receive a deposit of nanotubes. The target 15 has a free surface, in order words not covered by the sample and the sample 16 offers a free surface for the growth of the nanotubes. A hydrogen plasma predominates in the chamber. The target 15 provides the supply in carbon through the intermediary of the bombardment of plasma ions. The sample comprises, on its free surface, a catalytic deposit. Among the catalysts known to those skilled in the art, may be cited iron, cobalt, nickel, platinum and molybdenum. The growth of the nanotubes is thereby localised on the catalyst. The deposition takes place at a temperature typically above 300° C. The gas used to obtain the plasma may be pure hydrogen. It may also be a gaseous mixture comprising hydrogen and one or several noble gases chosen for example from among argon, krypton and xenon. The mixture may also contain nitrogen or ammonia known to act at the level of the carbon crystal. It may also contain a carbonated gas such as CO or acetylene.

Figure 3:
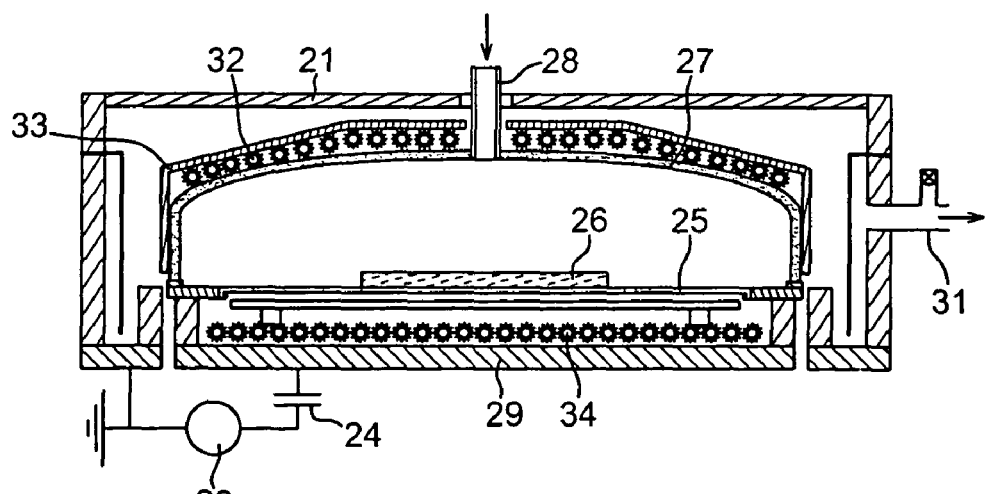
FIG. 3 is a schematic transversal cross-section of a deposition chamber enabling the method according to the invention to be used.

FIG. 3 is a schematic cross-sectional view of a deposition chamber enabling the use of the method according to the invention. Said chamber enables a secondary vacuum to be formed. In said chamber, a quartz cloche 27 makes it possible to limit the reaction zone where the plasma is formed. Said cloche 27 enables the introduction of gas via a gas inlet 28. The cloche lies on a sole piece 29 electrically insulated from the frame 21. An RF generator 23, connected in series with a capacitor 24, makes it possible to provide an RF voltage between the frame 21, serving as the cathode, and the sole piece 29, serving as the anode. A gas outlet 31 makes it possible to pump the interior of the frame 21. A first heating device 32 is arranged above the cloche 27 and under a heat reflector 33. A second heating device 34, placed in the low position, makes it possible to heat the graphite target 25. The target 25 lies on the sole piece 29 and supports a sample 26 (or several samples). The target and the sample are therefore at the same electric potential.

Figure 4:
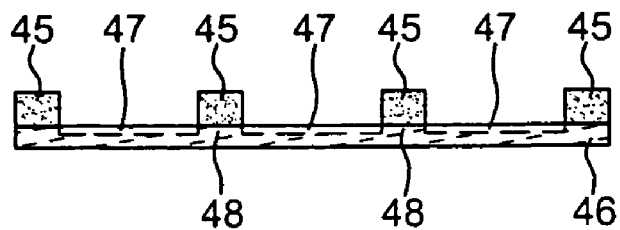
FIG. 4 is a cross-sectional view of a specific arrangement of the target and the sample used for the present invention.

FIG. 4 is a cross-sectional view of a specific arrangement of a graphite target 45, in the shape of a grid arranged on a sample 46. The sample 46 is for example a wafer of silicon of 200 or 300 mm diameter. Said wafer comprises active zones 47 intended to receive carbon nanotubes and separated by cut paths 48 (typically 0.5 mm wide).

Rather than depositing a gridded graphite target on a wafer serving as sample, it is possible to integrate the target in the sample. This may be achieved by carrying out a deposition of target material on the cut paths of the wafer, or on the non active zones of the wafer.

Embodiment No 1

According to this first embodiment, the samples comprise a multilayer of materials deposited on a substrate in silicon. On the substrate, one finds successively a layer of titanium of 60 nm thickness, a layer of TiN of 65 nm thickness and a layer of nickel of 3 nm thickness.

The sample is placed in the reaction chamber represented in FIG. 3. In said chamber, the sample is subjected to a temperature of 500° C., under a pressure of 150 mTorr (20 Pa) of hydrogen and for 20 minutes. A pure hydrogen plasma is then formed with a power of 300 W at the pressure of 150 mTorr (20 Pa). The carbon nanotubes deposition phase lasts for 1 hour.

Figure 5:
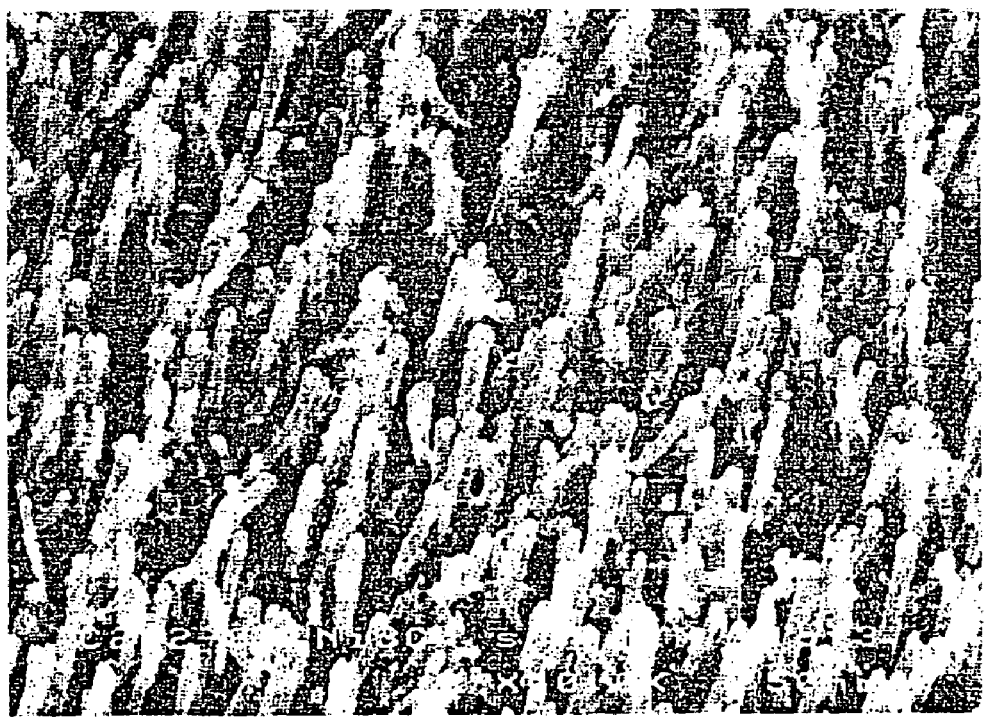
FIG. 5 is a photograph obtained by scanning electron microscope of carbon nanotubes obtained by the method according to the invention.

FIG. 5 is a photograph, obtained by scanning electron microscope, of the nanotubes obtained. Said nanotubes are vertical. They have an average diameter of 36 nm and a height of 400 nm. The selectivity of the deposit is excellent. No parasite carbonated deposit is observed outside of the catalyst grains.

Embodiment No 2

Figure 6:
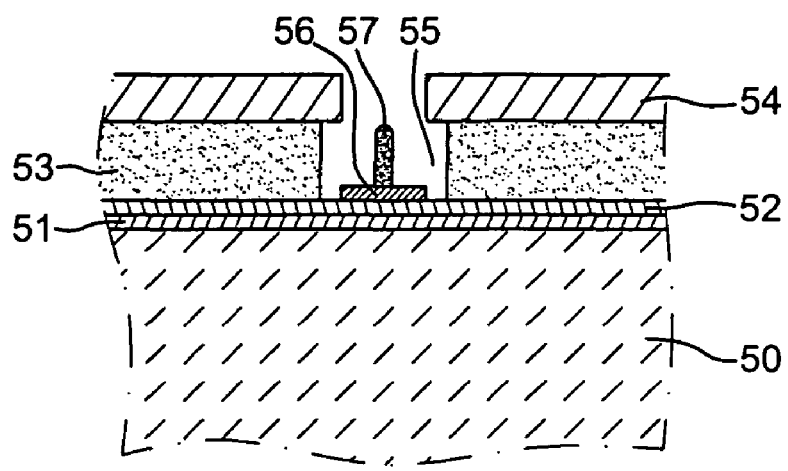
FIG. 6 is a cross-sectional view of a triode cavity of a field emitting emission plate, the electron emitting source of which consists of carbon nanotubes obtained by the method according to the invention.

According to this second embodiment, the sample comprises a multilayer of materials deposited on a substrate in silicon. On said substrate, one forms on triode structures in the following manner, in relation to FIG. 6. One deposits successively on a substrate 50, a layer 51 of titanium of 60 nm thickness, a layer 52 of TiN of 65 nm thickness, an insulating layer 53 (in silicon oxide, for example) of 300 nm thickness and another layer 54 of TiN of 200 nm thickness. By an etching operation, cavities are opened up to the layer 52 of TiN, which plays the role of cathodic conductor. FIG. 6 only shows a single cavity 55. A pellet of nickel 56 of 3 nm thickness is then localised by photolithography at the base of the cavity 55 and in its centre.

The sample is placed in the reaction chamber represented in FIG. 3. In said chamber, the sample is subjected to a temperature of 500° C., under a pressure of 150 mTorr (20 Pa) of pure hydrogen and for 20 minutes. At the same pressure, a plasma containing 25% of argon and 75% of hydrogen is then formed with a power of 300 W. The carbon nanotubes deposition phase is carried out for 1 hour. A stem-shaped element 57, obtained by vertical growth of carbon nanotubes, is then formed. The element 57 constitutes an electron emission source, the layers 51 and 52 playing the role of cathodic conductors and the layer 54 playing the role of extraction grid.

Those skilled in the art could replace argon by another known gas in order to favour the sputtering, such as xenon or even krypton for example.

Embodiment No 3

According to this third embodiment, the samples comprise a multilayer of materials deposited on a substrate in borosilicate glass. On said substrate, one finds successively a layer of molybdenum of 200 nm thickness, a layer of amorphous silicon of 1.4 µm thickness, a layer of TiN of 65 nm thickness and a layer of nickel of 3 nm thickness.

The sample is placed in the reaction chamber represented in FIG. 3. In said chamber, the sample is subjected to a temperature of 500° C., under a pressure of 150 mTorr (20 Pa) of hydrogen and for 20 minutes. A pure hydrogen plasma is then formed at the same pressure with a power of 300 W for 10 minutes. Then, a plasma containing 95% of hydrogen and 5% of acetylene is formed for 15 minutes.

Figure 7:
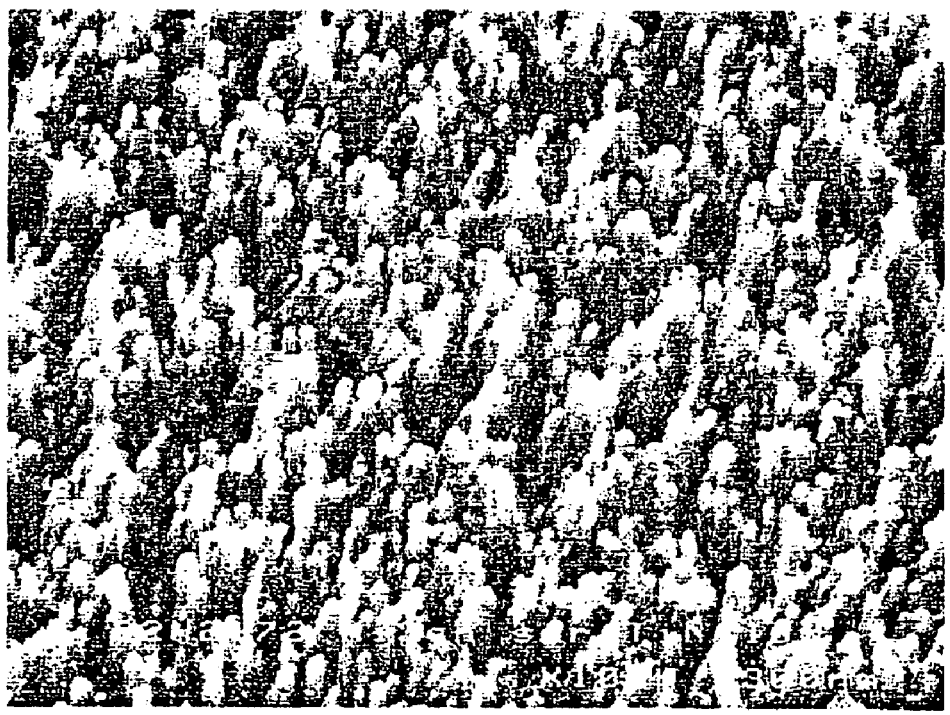
FIG. 7 is another photograph obtained by scanning electron microscopy of carbon nanotubes obtained by the method according to the invention.

FIG. 7 is a photograph, obtained by scanning electron microscope, of the nanotubes obtained.

The invention claimed is:

1. A method for growing oriented carbon nanotubes on a sample, using a target of carbon or variety of carbon, comprising:
   conducting the method in an RF sputtering device comprising a deposition chamber where a plasma predominates, and comprising a cathode, an anode and providing an RF voltage, wherein
   the cathode has a main face opposite a main face of the anode,
   the sample and the target are placed between the anode and the cathode, above the anode and in front of the cathode,
   the sample is arranged in contact with the target in such a way that the target presents a free surface to the cathode,
   the sample presents to the cathode, a free surface comprising at least partially a catalytic layer,
   the target is in direct contact with the anode and the sample,
   the sample is in direct contact with the target,
   the plasma causes the growth of carbon nanotubes on the catalytic layer, and
   there is no hot filament in the RF sputtering device.

2. The method according to claim 1, wherein the plasma is a hydrogen plasma.

3. The method according to claim 1, wherein the plasma is a plasma of a gaseous mixture comprising hydrogen.

4. The method according to claim 3, wherein the gaseous mixture comprises at least one noble gas.

5. The method according to claim 4, wherein said noble gas is a member selected from the group consisting of argon, krypton and xenon.

6. The method according to claim 3, wherein the gaseous mixture comprises nitrogen or ammonia.

7. The method according to claim 3, wherein the gaseous mixture comprises a carbonated gas.

8. The method according to claim 7, wherein the carbonated gas is a member selected from the group consisting of CO and acetylene.

9. The method according to claim 1, wherein the method is carried out at a temperature above 300° C.

10. The method according to claim 1, wherein the free surface of the target has a grid shape.

11. The method according to claim 1, wherein the target is formed by a depositing target material on the sample out of said free surface of said sample.

12. The method according to any one of claims 1-11, wherein the substrate is a semiconductor material or glass.

13. The method according to any one of claims 1-11, wherein the oriented carbon nanotubes are grown at a base of triode cavities of a field emitting emission plate, said carbon nanotubes thereby constituting electron emission sources.

14. The method according to claim 1, wherein the anode and cathode are flat electrodes.

* * * * *